(12) United States Patent
Kamtekar

(10) Patent No.: US 11,667,835 B2
(45) Date of Patent: Jun. 6, 2023

(54) LIGHT-EMITTING COMPOSITION

(71) Applicant: Sumitomo Chemical Company Limited, Tokyo (JP)

(72) Inventor: Kiran Kamtekar, Godmanchester (GB)

(73) Assignee: Sumitomo Chemical Company Limited, Tokyo (JP)

( * ) Notice: Subject to any disclaimer, the term of this patent is extended or adjusted under 35 U.S.C. 154(b) by 394 days.

(21) Appl. No.: 16/955,755

(22) PCT Filed: Dec. 20, 2018

(86) PCT No.: PCT/GB2018/053721
§ 371 (c)(1),
(2) Date: Jun. 18, 2020

(87) PCT Pub. No.: WO2019/122899
PCT Pub. Date: Jun. 27, 2019

(65) Prior Publication Data
US 2021/0079295 A1   Mar. 18, 2021

(30) Foreign Application Priority Data
Dec. 21, 2017 (GB) .................................... 1721674

(51) Int. Cl.
*C09K 11/06* (2006.01)
*H01L 51/00* (2006.01)
*H01L 51/50* (2006.01)

(52) U.S. Cl.
CPC .......... *C09K 11/06* (2013.01); *H01L 51/0043* (2013.01); *H01L 51/0067* (2013.01);
(Continued)

(58) Field of Classification Search
CPC ............ C09K 11/06; C09K 2211/1466; C09K 2211/1018; C09K 2211/1059;
(Continued)

(56) References Cited

U.S. PATENT DOCUMENTS 6,229,012 B1 * 5/2001 Hu ........................ C07D 251/24
544/216
2011/0037027 A1 * 2/2011 Stoessel ............... C07D 471/14
548/440
(Continued)

FOREIGN PATENT DOCUMENTS

CN          103570629 A      2/2014
JP          2006-225322 A    8/2006
(Continued)

OTHER PUBLICATIONS

Combined Search and Examination Report for UK Application No. GB1721674.8, dated Jun. 29, 2018.
(Continued)

*Primary Examiner* — Mark Kopec
*Assistant Examiner* — Jaison P Thomas
(74) *Attorney, Agent, or Firm* — Wolf, Greenfield & Sacks, P.C.

(57) ABSTRACT

A composition comprising a light-emitting material having a photoluminescent spectrum with a peak wavelength of more than 600 nm and material comprising a group of formula (I): wherein 1 2 3 4 $Ar^1$, $Ar^2$, $Ar^3$ and $Ar^4$ are each independently a C6-20 aryl group which is unsubstituted or substituted with one or more substituents, $Ar^5$ independently in each occurrence is a heteroarylene group or a $C^{6-20}$
(Continued)

arylene group which is unsubstituted or substituted with one or more substituents, and m is 0, 1, 2 or 3. The composition may be used in an organic light-emitting device.

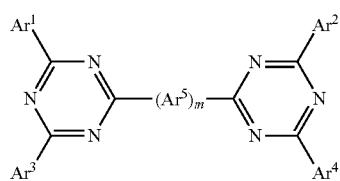

(I)

9 Claims, 1 Drawing Sheet

(52) U.S. Cl.
CPC .. *C09K 2211/1466* (2013.01); *H01L 51/5056* (2013.01); *H01L 51/5072* (2013.01); *H01L 51/5092* (2013.01)

(58) Field of Classification Search
CPC ............. H01L 51/0035; H01L 51/0043; H01L 51/0067; H01L 51/5016; H01L 51/5056; H01L 51/5072; H01L 51/5092; H01L 51/0072; H01L 51/50; H05B 33/20; C07D 251/24

See application file for complete search history.

(56) References Cited

U.S. PATENT DOCUMENTS

| 2012/0097899 | A1* | 4/2012 | Parham | C07D 403/14 528/7 |
| 2012/0146005 | A1* | 6/2012 | Yang | C08G 73/0644 257/E51.027 |
| 2012/0228554 | A1* | 9/2012 | Franz | C07D 403/14 252/301.16 |
| 2016/0329502 | A1* | 11/2016 | Dyatkin | C09K 11/025 |
| 2017/0186959 | A1 | 6/2017 | Tanaka et al. | |
| 2019/0214577 | A1* | 7/2019 | Pan | C07D 209/86 |

FOREIGN PATENT DOCUMENTS

| JP | 2007-223928 A | 9/2007 |
| WO | WO 2013/093490 A1 | 6/2013 |
| WO | WO 2017/103586 A1 | 6/2017 |

OTHER PUBLICATIONS

International Search Report and Written Opinion for International Application No. PCT/GB2018/053721, dated Mar. 29, 2019.

* cited by examiner

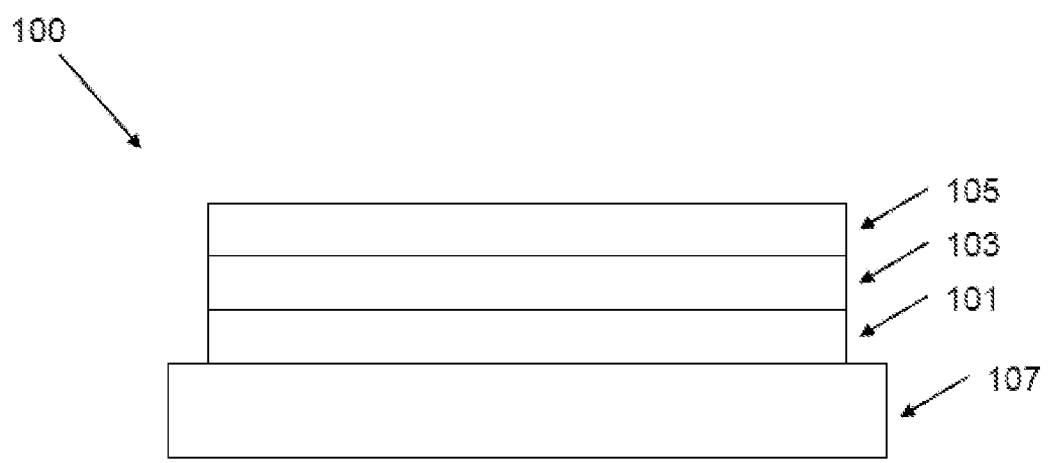

LIGHT-EMITTING COMPOSITION

RELATED APPLICATIONS

This Application is a national stage filing under 35 U.S.C. § 371 of international PCT application no. PCT/GB2018/053721, filed Dec. 20, 2018, which claims priority to United Kingdom patent application no. GB 1721674.8, filed Dec. 21, 2017, each of which is incorporated herein by reference in its entirety.

FIELD OF THE INVENTION

The present invention relates to light-emitting compositions, in particular compositions suitable for use in organic light-emitting devices.

BACKGROUND OF THE INVENTION

Electronic devices containing active organic materials include devices such as organic light emitting diodes (OLEDs), organic photoresponsive devices (in particular organic photovoltaic devices and organic photosensors), organic transistors and memory array devices. Devices containing active organic materials can offer benefits such as low weight, low power consumption and flexibility. Moreover, use of soluble organic materials allows use of solution processing in device manufacture, for example inkjet printing or spin-coating.

An OLED includes an anode, a cathode and one or more organic layers between the anode and cathode including at least one organic light-emitting layer.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

OLEDs containing infrared emitting materials are also known as disclosed in, for example, Chuk-Lam Ho, Hua Li and Wai-Yeung Wong, "Red to near-infrared organometallic phosphorescent dyes for OLED applications", J. Organomet. Chem. 751 (2014), 261-285.

WO 2017/103586 discloses hosts for infrared emitters.

US 2006/141287 discloses materials for use in an electron-transporting layer.

US 2016/329502 discloses organic compounds with two substituted triazine, pyridine, pyrimidine or pyrazine rings attached to an aromatic or heteroaromatic ring system.

CN103570629 discloses benzanthracene derivatives containing pyrimidinyl, pyrazinyl or triazinyl groups US 2011/0240982 discloses compounds of formula:

Ar-(T)$_n$ where n represents an integer of 1 or 2; Ar represents a fused polycyclic aromatic group which has three or more rings; and T represents a triazine group.

JP 2006-225320 discloses 1,3,5-triazine compounds.

SUMMARY OF THE INVENTION

In a first aspect the invention provides a composition comprising a light-emitting material having a photoluminescent spectrum with a peak wavelength of more than 600 nm and material comprising a group of formula (I):

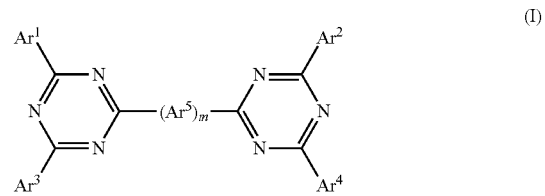

(I)

wherein:
Ar$^1$, Ar$^2$, Ar$^3$ and Ar$^4$ are each independently a C$_{6-20}$ aryl group which is unsubstituted or substituted with one or more substituents, Ar$^5$ independently in each occurrence is a heteroarylene group or a C$_{6-20}$ arylene group which is unsubstituted or substituted with one or more substituents, and m is 0, 1, 2 or 3.

In a second aspect the invention provides a solution comprising a composition according to the first aspect dissolved in one or more solvents.

In a third aspect the invention provides an organic light-emitting device comprising an anode, a cathode and a light-emitting layer between the anode and cathode wherein the light-emitting layer comprises a composition according to the first aspect.

In a fourth aspect the invention provides a method of forming an organic light-emitting device according to the third aspect, the method comprising the step of depositing the light-emitting layer over one of the anode and cathode, and depositing the other of the anode and cathode over the light-emitting layer.

DESCRIPTION OF THE DRAWINGS

The invention will now be described in more detail with reference to the FIGURES, in which:
FIG. 1 illustrates an OLED according to an embodiment of the invention.

DETAILED DESCRIPTION OF THE INVENTION

There is provided a material comprising a group of formula (I):

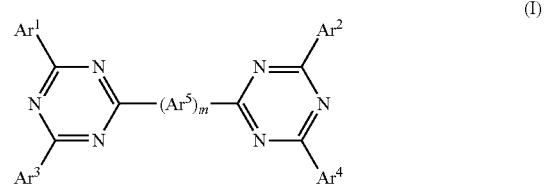

(I)

wherein $Ar^1$, $Ar^2$, $Ar^3$ and $Ar^4$ are each independently a $C_{6-20}$ aryl group which is unsubstituted or substituted with one or more substituents, and wherein $Ar^5$ independently in each occurrence is a heteroarylene group or a $C_{6-20}$ arylene group which is unsubstituted or substituted with one or more substituents and m is 1, 2 or 3, preferably 1.

$Ar^5$ may be a monocyclic ring or may consist of two or more fused rings. Exemplary arylene groups $Ar^5$ include, without limitation, phenylene, preferably 1,4-linked phenylene; a group of two or more fused benzene rings, for example naphthylene, optionally 1,4- or 2,6-linked naphthalene or anthracene, optionally 5,10-linked anthracene; and fluorene, optionally 2,7-linked fluorene. Exemplary heteroarylene groups $Ar^5$ include heteroarylene groups which are less electrophilic than benzene, for example 6-membered heteroarylene groups having ring atoms selected from C and N atoms, for example pyridine.

$Ar^5$ may be unsubstituted or substituted with one or more substituents $R^1$ which may be the same or different in each occurrence. $R^1$ may be selected from substituents as described below.

Optionally, $Ar^5$ is selected from:

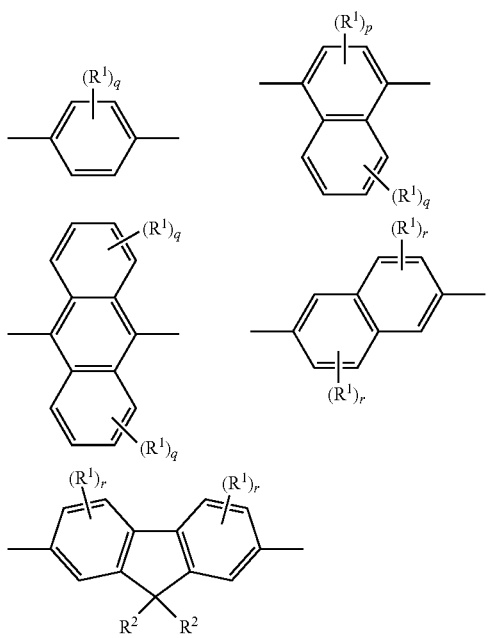

wherein $R^1$ in each occurrence is independently a substituent; $R^2$ in each occurrence is independently a substituent wherein the $R^2$ groups may be linked to form a ring; p is 0, 1 or 2; q is 0, 1, 2, 3 or 4; and r is 0, 1, 2 or 3.

Preferably, $R^1$ in each occurrence is independently selected from the group consisting of F; CN; $NO_2$; and $C_{1-20}$ alkyl wherein one or more non-adjacent, non-terminal C atoms of the alkyl group may be replaced with O, S, $NR^3$ or $SiR^3_2$, COO or CO wherein $R^3$ in each occurrence is a $C_{1-20}$ hydrocarbyl group, optionally a $C_{1-12}$ alkyl group, unsubstituted phenyl, or phenyl substituted with one or more alkyl groups. Most preferably, the or each $R^1$ is a $C_{1-12}$ alkyl group.

A "non-terminal carbon atom" of an alkyl group as used herein means carbon atoms other than the methyl group of a n-alkyl chain or the methyl groups of a branched alkyl chain.

Preferably, $R^2$ in each occurrence is independently selected from the group consisting of:
- alkyl, optionally $C_{1-20}$ alkyl, wherein one or more non-adjacent, non-terminal C atoms may be replaced with optionally substituted aryl or heteroaryl, O, S, C=O or —COO—, and one or more H atoms may be replaced with F;
- aryl and heteroaryl groups, preferably $C_{6-20}$ aryl groups, more preferably phenyl, that may be unsubstituted or substituted with one or more substituents; and
- a linear or branched chain of aryl or heteroaryl groups, preferably $C_{6-20}$ aryl groups, more preferably phenyl, each of which groups may independently be substituted In the case where $R^2$ comprises an aryl or heteroaryl group, or a linear or branched chain of aryl or heteroaryl groups, the or each aryl or heteroaryl group may be unsubstituted or substituted with one or more substituents. Substituents are optionally selected from the group consisting of: alkyl, for example $C_{1-20}$ alkyl, wherein one or more non-adjacent C atoms may be replaced with O, S, C=O and —COO— and one or more H atoms of the alkyl group may be replaced with F.

Optionally, substituents of $Ar^1$, $Ar^2$, $Ar^3$ and $Ar^4$ are selected from $R^4$, wherein $R^4$ in each occurrence is independently selected from substituents $R^1$ as described above.

$Ar^1$, $Ar^2$, $Ar^3$ and $Ar^4$ are each preferably phenyl.

The material comprising a group of formula (I) may be a polymer in which one, two or more of $Ar^1$, $Ar^2$, $Ar^3$ and $Ar^4$ is linked directly to a polymer chain of the polymer or linked to a polymer chain by a divalent linking group $R^5$. Preferably, the group of formula (I) is bound to a polymer chain by one or two direct bonds or by one or two divalent groups $R^5$.

In embodiments, the material is a polymer and the group of formula (I) is a repeat unit having two direct bonds to the polymer chain, optionally a group of formula (Ia), (Ib) or (Ic):

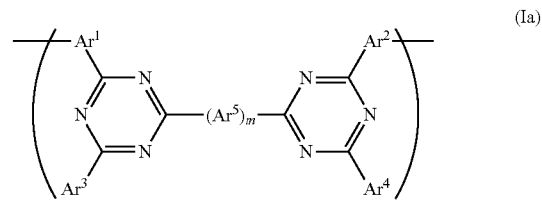

(Ia)

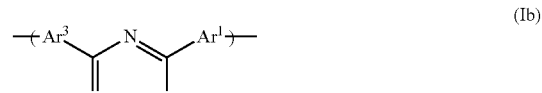

(Ib)

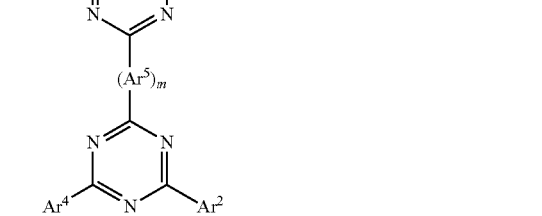

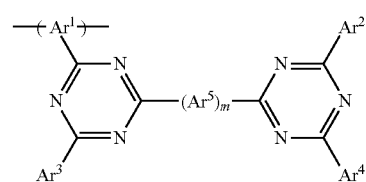

(Ic)

The repeat unit of formula (Ia) is preferred. Exemplary repeat units of formula (Ia) may be formed from the following monomers:
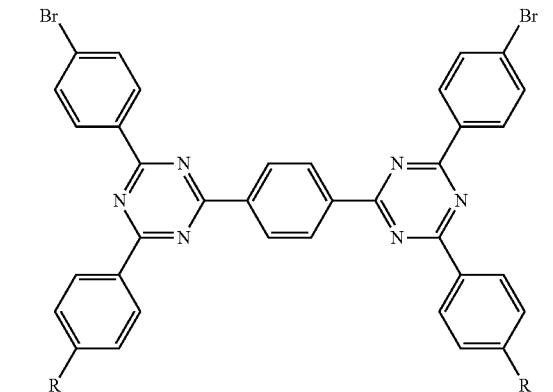
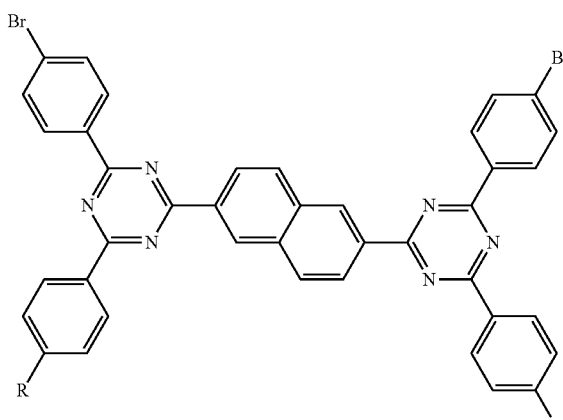
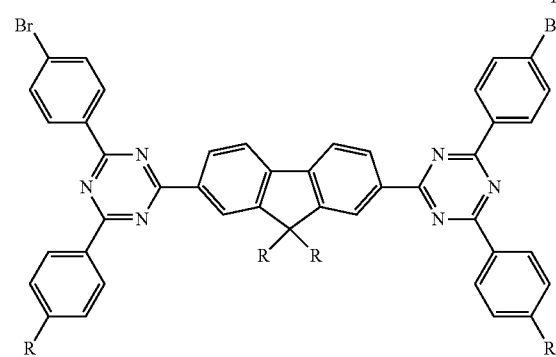
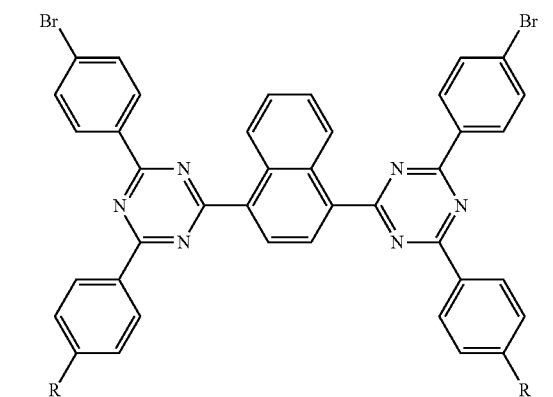
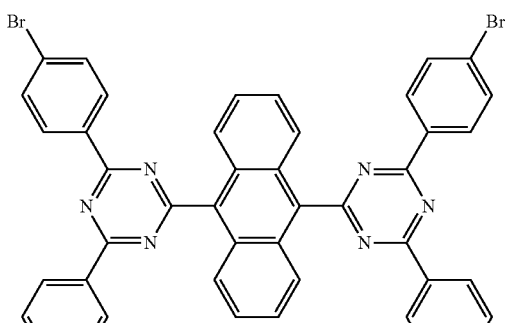
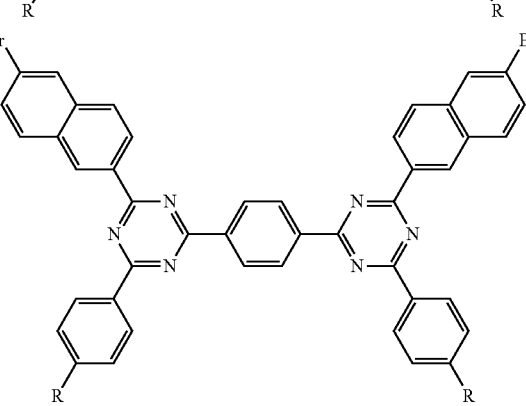
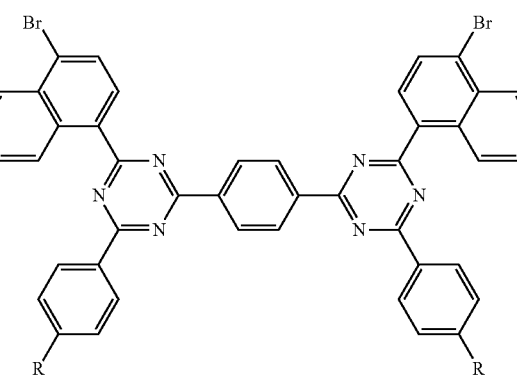
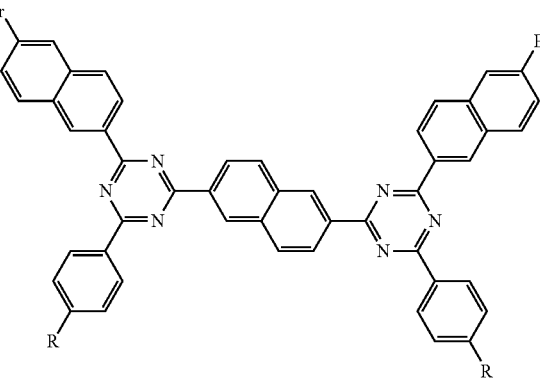

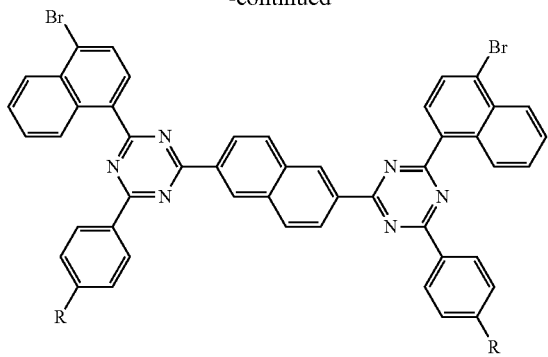

where each R bound to fluorene and each R bound to phenyl is independently as described with respect to $R^2$ and $R^4$ respectively.

Preferably, the polymer comprising repeat units of formula (Ia) (Ib) or (Ic) is a conjugated polymer. Preferably the repeat units of formulae (Ia), (Ib), and (Ic) are directly bound to aromatic or heteroaromatic groups of adjacent repeat units.

The polymer comprising a repeat unit of formula (Ia), (Ib) or (Ic) may be a homopolymer or a copolymer comprising repeat units of formula (I) and one or more co-repeat units.

Co-repeat units may include, without limitation, $C_{6-20}$ arylene repeat units; 5-20 membered heteroarylene repeat units; and/or arylamine repeat units, each of which may be unsubstituted or substituted with one or more substituents.

Repeat units of formula (I) may make up 1-90 mol %, optionally 10-50 mol %, of the repeat units of a copolymer.

Arylene repeat units may be selected from formulae (VII)-(X):

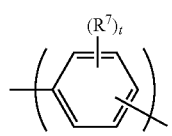
(VII)

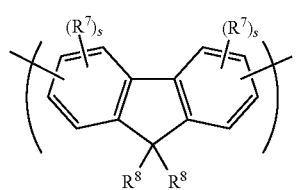
(VIII)

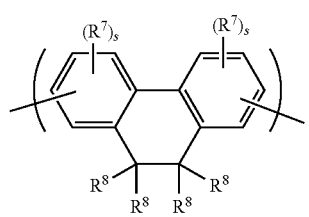
(IX)

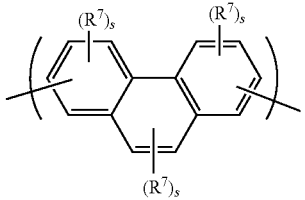
(X)

wherein t in each occurrence is independently 0, 1, 2, 3 or 4, preferably 1 or 2; $R^7$ independently in each occurrence is a substituent; s in each occurrence is independently 0, 1 or 2, preferably 0 or 1; and $R^8$ independently in each occurrence is a substituent wherein two $R^8$ groups may be linked to form an unsubstituted or substituted ring.

Where present, each $R^7$ and $R^8$ may independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups, preferably $C_{6-20}$ aryl groups, more preferably phenyl, that may be unsubstituted or substituted with one or more substituents; and
  a linear or branched chain of aryl or heteroaryl groups, preferably $C_{6-20}$ aryl groups, more preferably phenyl, each of which groups may independently be substituted, optionally a group of formula —$(Ar^{12})_v$ wherein each $Ar^{12}$ is independently an aryl or heteroaryl group and v is at least 2, preferably a branched or linear chain of phenyl groups.

In the case where $R^7$ or $R^8$ comprises an aryl or heteroaryl group, or a linear or branched chain of aryl or heteroaryl groups, the or each aryl or heteroaryl group may be substituted with one or more substituents $R^6$ selected from the group consisting of:
  alkyl, for example $C_{1-20}$ alkyl, wherein one or more non-adjacent C atoms may be replaced with O, S, substituted N, C=O and —COO— and one or more H atoms of the alkyl group may be replaced with F;
  $NR^9_2$, $OR^9$, $SR^9$, $SiR^9_3$ and
  fluorine, nitro and cyano;
wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^{10}$— wherein $R^{10}$ is a substituent and is optionally a $C_{1-40}$ hydrocarbyl group, optionally a $C_{1-20}$ alkyl group.

Preferred substituents of aryl or heteroaryl groups of $R^7$ or $R^8$ are selected from $C_{1-20}$ alkyl.

In the case where two groups $R^8$ form a ring, the one or more substituents of the ring, if present, are optionally selected from $C_{1-20}$ alkyl groups.

Preferably, each $R^7$, where present, and $R^8$ is independently selected from $C_{1-40}$ hydrocarbyl. Preferred $C_{1-40}$ hydrocarbyl groups are $C_{1-20}$ alkyl; unsubstituted phenyl; phenyl substituted with one or more $C_{1-20}$ alkyl groups; and a linear or branched chain of phenyl groups, wherein each phenyl may be unsubstituted or substituted with one or more $C_{1-20}$ alkyl groups.

Arylene co-repeat units may form 10-90 mol % of the repeat units of the polymer.

Arylamine co-repeat units are preferably selected from repeat units of formula (VI):

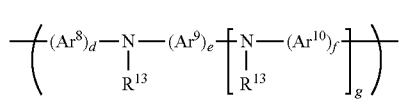 (VI)

wherein $Ar^8$, $Ar^9$ and $Ar^{10}$ in each occurrence are independently selected from substituted or unsubstituted aryl or heteroaryl, g is 0, 1 or 2, preferably 0 or 1, $R^{13}$ independently in each occurrence is a substituent, and d, e and f are each independently 1, 2 or 3.

$R^{13}$, which may be the same or different in each occurrence when g is 1 or 2, is preferably selected from the group consisting of alkyl, optionally $C_{1-20}$ alkyl, $Ar^{11}$ and a branched or linear chain of $Ar^{11}$ groups wherein $Ar^{11}$ in each occurrence is independently substituted or unsubstituted aryl or heteroaryl.

Any two aromatic or heteroaromatic groups selected from $Ar^8$, $Ar^9$, and, if present, $Ar^{10}$ and $Ar^{11}$ that are directly bound to the same N atom may be linked by a direct bond or a divalent linking atom or group. Preferred divalent linking atoms and groups include O, S; substituted N; and substituted C.

$Ar^8$ and $Ar^{10}$ are preferably $C_{6-20}$ aryl, more preferably phenyl, which may be unsubstituted or substituted with one or more substituents.

In the case where g=0, $Ar^9$ is preferably $C_{6-20}$ aryl, more preferably phenyl, that may be unsubstituted or substituted with one or more substituents.

In the case where g=1, $Ar^9$ is preferably $C_{6-20}$ aryl, more preferably phenyl or a polycyclic aromatic group, for example naphthalene, perylene, anthracene or fluorene, that may be unsubstituted or substituted with one or more substituents.

$R^{13}$ is preferably $Ar^{11}$ or a branched or linear chain of $Ar^{11}$ groups. $Ar^{11}$ in each occurrence is preferably phenyl that may be unsubstituted or substituted with one or more substituents.

Exemplary groups $R^{13}$ include the following, each of which may be unsubstituted or substituted with one or more substituents, and wherein * represents a point of attachment to N:

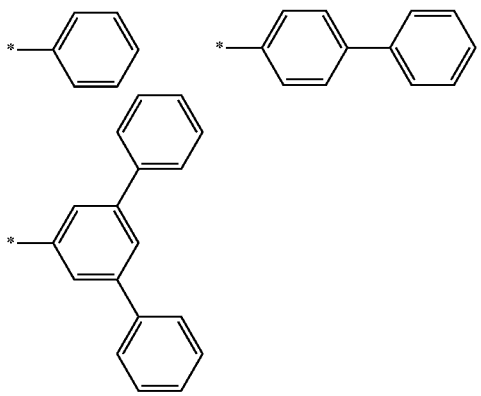

d e and f are preferably each 1.

$Ar^8$, $Ar^9$, and, if present, $Ar^{10}$ and $Ar^{11}$ are each independently unsubstituted or substituted with one or more, optionally 1, 2, 3 or 4, substituents. Exemplary substituents may be selected from substituted or unsubstituted alkyl, optionally $C_{1-20}$ alkyl, wherein one or more non-adjacent C atoms may be replaced with optionally substituted aryl or heteroaryl (preferably phenyl), O, S, C=O or —COO— and one or more H atoms may be replaced with F.

Preferred substituents of $Ar^8$, $Ar^9$, and, if present, $Ar^{10}$ and $Ar^{11}$ are $C_{1-40}$ hydrocarbyl, preferably $C_{1-20}$ alkyl.

Preferred repeat units of formula (VI) include unsubstituted or substituted units of formulae (VI-1), (VI-2) and (VI-3):

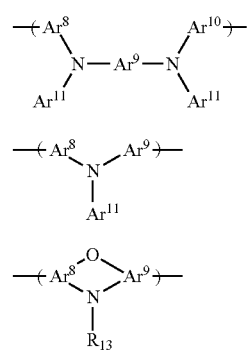

In embodiments, $Ar^1$ is a direct bond or is substituted with Sp1 and the group of formula (I) is a substituent of formula (Id) pendant from the polymer chain:

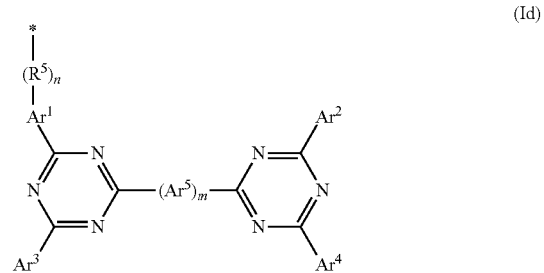 (Id)

wherein n is 0 or 1

The group of formula (Id) may be a part of a repeat unit of formula (Ie) of the polymer:

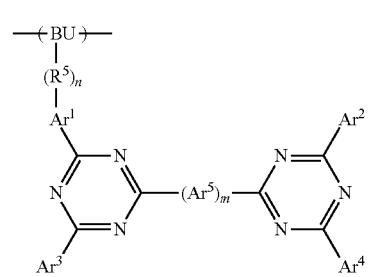 (Ie)

wherein BU is a backbone unit of the repeat unit which may be unsubstituted or substituted with one or more substituents.

The polymer comprising a repeat unit of formula (Ie) may be a non-conjugated or conjugated polymer.

If the polymer comprising a repeat unit of formula (Ie) is a conjugated polymer then BU is optionally selected from aromatic and heteroaromatic groups, optionally groups of formulae (VII)-(X) described above wherein the repeat unit is substituted with a group of formula (Id).

In the case of a non-conjugated polymer comprising a repeat unit of formula (Ie), BU may be an ethylene unit, for example a repeat unit formed by polymerisation of an acrylate or alkylacrylate monomer, optionally a methacrylate monomer. The group of formula (Id) may be the only substituent of the repeat unit of formula (Ie), or it may be substituted with one or more substituents, optionally one or more $C_{1-6}$ alkyl groups.

Optionally, $R^5$ is a C1-20 linear or branched alkylene chain wherein one or more non-adjacent C atoms of the alkylene chain may be replaced with O, S, C=O, COO and one or more C atoms may be replaced with phenyl.

Exemplary groups $R^5$ include, without limitation, an ester group of formula —C(=O)O—$R^{14}$— wherein $R^{14}$ is a direct bond or a $C_{1-10}$ alkyl group, and a $C_{1-20}$ hydrocarbyl group, optionally a group selected from alkyl; phenyl; phenylalkyl; and alkylphenyl.

Exemplary repeat units of formula (Ie) are:

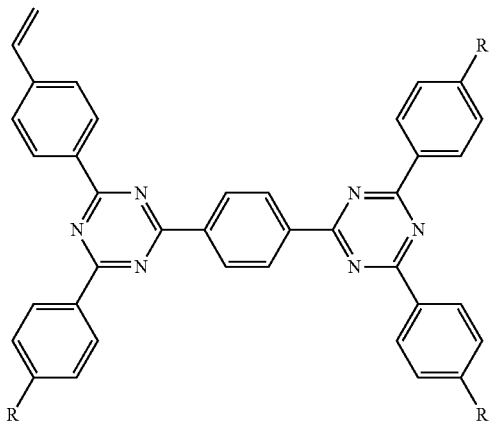

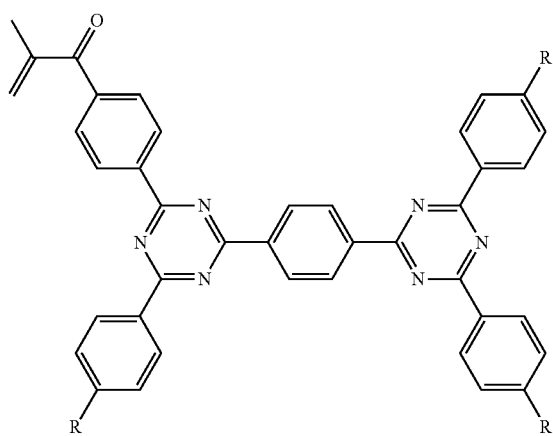

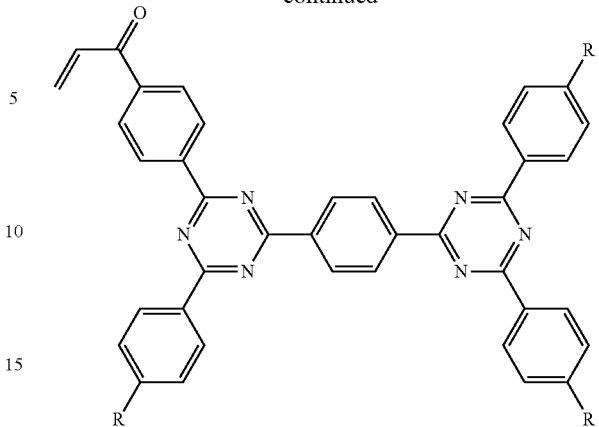

wherein R is as described with reference to $R^4$.

Polymers as described herein may have a polystyrene-equivalent number-average molecular weight (Mn) measured by gel permeation chromatography in the range of about $3 \times 10^3$ to $1 \times 10^8$, and preferably $1 \times 10^3$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Polymers as described herein are preferably amorphous.

In embodiments, the material comprising a group of formula (I) is a non-polymeric compound, i.e. the group of formula (I) is not bound, directly or indirectly, to a polymer chain. Optionally, a non-polymeric compound as described herein has a molecular weight of less than about 2,000 or less than about 1,000 Daltons.

A material comprising a group of formula (I) preferably has a lowest unoccupied molecular orbital (LUMO) level of at least 2.6 eV from vacuum level, preferably at least 2.7 or at least 2.8 eV from vacuum level as measured by square wave voltammetry.

Light-Emitting Composition

A material comprising a group of formula (I) may be used as a host for a light-emitting material, preferably a phosphorescent material.

The material comprising a group of formula (I) has an excited state energy level that is preferably at least the same as, and more preferably higher than, the corresponding excited state energy level of the light-emitting material. In the case of a fluorescent material, the lowest singlet excited state ($S_1$) energy level of the material comprising a group of formula (I) is preferably at least the same as or higher than the $S_1$ energy level of the fluorescent material. In the case of a phosphorescent material, the lowest triplet excited state ($T_1$) energy level of the material comprising a group of formula (I) is preferably at least the same as or higher than the $T_1$ energy level of the phosphorescent material.

The singlet excited state energy levels of a material comprising a group of formula (I) and a fluorescent compound may be determined from their photoluminescence spectra.

The $T_1$ level of a material comprising a group of formula (I) may be determined from the energy onset of its phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

The $T_1$ of a phosphorescent material may be measured from its room temperature (25° C.) phosphorescence spectrum.

The light-emitting material may have a LUMO that is less than 0.4 eV deeper (further from vacuum level) than that of the host.

The light-emitting material may be mixed with or covalently bound to the material comprising a group of formula (I). It will therefore be appreciated that a "composition" of the light-emitting material and the material comprising a group of formula (I) as described herein may be a single compound, such as a polymer, or a mixture comprising or consisting of the material comprising a group of formula (I) and the light-emitting material.

The light-emitting material may be provided in an amount in the range of 0.1-40 wt %, optionally 1-20 wt %, in a composition comprising a host material comprising a group of formula (I) mixed with the infrared emitter.

In the case where the host material comprising a group of formula (I) is a polymer, the light-emitting material may be provided as a side-group or end group of the polymer backbone or as a repeat unit in the backbone of the polymer. In this case, repeat units comprising the light-emitting material may form 0.1-40 mol % of the repeat units of the polymer.

Light-Emitting Material

Preferably, a light-emitting material as described herein is an infrared emitter having a photoluminescence spectrum with a peak of at least 650 nm, optionally in the range of 650-1000 nm, preferably 700-850 nm.

The photoluminescence spectrum of a light-emitting material may be measured by casting 5 wt % of the material in a polystyrene film onto a quartz substrate and measuring in a nitrogen environment using apparatus C9920-02 supplied by Hamamatsu.

The infrared emitter as described herein may be a fluorescent or phosphorescent infrared emitter, preferably a phosphorescent emitter.

The infrared emitter is preferably a phosphorescent metal complex, optionally a complex of Ruthenium, Rhodium, Palladium, Silver, Tungsten, Rhenium, Osmium, Iridium, Platinum or Gold, preferably $Ir^{3+}$. The phosphorescent metal complex preferably comprises at least one C,N-cyclometallating bidentate ligand.

Exemplary infrared emitters are disclosed in Chuk-Lam Ho, Hua Li and Wai-Yeung Wong, "Red to near-infrared organometallic phosphorescent dyes for OLED applications", J. Organomet. Chem. 751 (2014), 261-285 and WO 2017/103584, the contents of which are incorporated herein by reference.

Organic Light-Emitting Device

A material comprising a group of formula (I) may be provided in an organic light-emitting device.

FIG. 1, which is not drawn to any scale, illustrates schematically an OLED 100 according to an embodiment. The OLED 100 is carried on substrate 107 and comprises an anode 101, a cathode 105 and a light-emitting layer 103 between the anode and the cathode.

The light-emitting layer comprises or consists of a material comprising a group of formula (I) and a light-emitting material, preferably an infrared material.

Preferably, light-emitting layer 103 is the only layer of the device which emits light when in use.

Preferably, at least 90% or 95% of the light emitted by the device when in use, more preferably all light, is light emitted from the light-emitting material.

Further layers (not shown) may be provided between the anode and the cathode including, without limitation, hole-transporting layers, electron-transporting layers, hole-blocking layers, electron-blocking layers, hole-injection layers and electron-injection layers.

Exemplary OLED structures including one or more further layers include the following:

Anode/Hole-injection layer/Light-emitting layer/Cathode

Anode/Hole transporting layer/Light-emitting layer/Cathode

Anode/Hole-injection layer/Hole-transporting layer/Light-emitting layer/Cathode

Anode/Hole-injection layer/Hole-transporting layer/Light-emitting layer/Electron-transporting layer/Cathode Anode/Hole-injection layer/Hole-transporting layer/Light-emitting layer/Electron-injecting layer/Cathode Preferably, the device comprises one or both, more preferably both, of a hole-injection layer and a hole-transporting layer.

Preferably, the device comprises at least one of an electron-transporting layer and an electron injection layer.

Charge Transporting and Charge Blocking Layers

A hole transporting layer may be provided between the anode of an OLED and the light-emitting layer.

An electron transporting layer may be provided between the cathode of an OLED and the light-emitting layer.

An electron blocking layer may be provided between the anode and the light-emitting layer.

A hole blocking layer may be provided between the cathode and the light-emitting layer.

Transporting and blocking layers may be used in combination. Depending on its HOMO and LUMO levels, a single layer may both transport one of holes and electrons and block the other of holes and electrons.

A charge-transporting layer or charge-blocking layer may be crosslinked, particularly if a layer overlying that charge-transporting or charge-blocking layer is deposited from a solution.

The crosslinkable group used for this crosslinking may be a crosslinkable group comprising a reactive double bond such and a vinyl or acrylate group, or a benzocyclobutane group. The crosslinkable group may be provided as a substituent pendant from the backbone of a charge-transporting or charge-blocking polymer. Following formation of a charge-transporting or charge blocking layer, the crosslinkable group may be crosslinked by thermal treatment or irradiation.

If present, a hole transporting layer located between the anode and the light-emitting layer preferably contains a hole-transporting material having a HOMO level of less than or equal to 5.5 eV, more preferably around 4.8-5.5 eV as measured by square wave voltammetry. The HOMO level of the hole transporting material of the hole-transporting layer may be selected so as to be within 0.2 eV, optionally within 0.1 eV, of the HOMO of a component of the hole-transporting layer, optionally the light-emitting material or the material comprising a group of formula (I), in order to provide a small barrier to hole transport.

A hole-transporting material of a hole-transporting polymer may be a polymer comprising a repeat unit of formula (VI) as described herein, optionally a homopolymer of a repeat unit of formula (VI) or a copolymer comprising a repeat unit of formula (VI) and one or more co-repeat units, optionally one or more arylene co-repeat units as described herein. One or more repeat units of such a hole-transporting polymer may be substituted with a crosslinkable group, optionally a crosslinkable double bond group and/or a crosslinkable benzocyclobutane group, that may be crosslinked following deposition of the hole-transporting polymer to form the hole-transporting layer.

If present, an electron transporting layer located between the light-emitting layers and cathode preferably has a LUMO level of around 2.5-3.5 eV as measured by square wave voltammetry. A layer of a silicon monoxide or silicon dioxide or other thin dielectric layer having thickness in the range of 0.2-2 nm may be provided between the light-emitting layer nearest the cathode and the cathode.

An electron transporting layer may contain a polymer comprising a chain of optionally substituted arylene repeat units, such as a chain of fluorene repeat units.

Hole Injection Layers

A conductive hole injection layer, which may be formed from a conductive organic or inorganic material, may be provided between the anode and the light-emitting layer or layers to assist hole injection from the anode into the layer or layers of semiconducting polymer. A hole transporting layer may be used in combination with a hole injection layer.

Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as $VO_x$, $MoO_x$ and $RuO_x$ as disclosed in Journal of Physics D: Applied Physics (1996), 29(11), 2750-2753.

Cathode

The cathode is selected from materials that have a work function allowing injection of electrons into the light-emitting layer or layers.

The cathode may consist of a single material such as a layer of aluminium. The cathode may comprise a plurality of metals, for example a bilayer of a low work function material and a high work function material such as calcium and aluminium as disclosed in WO 98/10621. The cathode may contain a layer containing elemental barium, for example as disclosed in WO 98/57381, Appl. Phys. Lett. 2002, 81(4), 634 and WO 02/84759 or a layer containing elemental magnesium. The cathode may contain a thin (e.g. 1-5 nm thick) layer of metal compound between the light-emitting layer(s) of the OLED and one or more conductive layers of the cathode, such as one or more metal layers. Exemplary metal compounds include an oxide or fluoride of an alkali or alkali earth metal to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a work function of less than 3.5 eV, more preferably less than 3.2 eV, most preferably less than 3 eV. Work functions of metals can be found in, for example, Michaelson, J. Appl. Phys. 48(11), 4729, 1977.

Layer Formation

A layer comprising a material comprising a group of formula (I) may be deposited by any suitable method including, without limitation, vacuum evaporation and deposition from a solution. Preferably the material comprising a group of formula (I) is deposited from a formulation comprising the material comprising a group of formula (I) dissolved in one or more organic solvents. The formulation may comprise the compound comprising a group of formula (I) and a light-emitting material dissolved therein.

Suitable solvents include, without limitation, benzenes with one or more alkyl substituents such as toluene and xylene and mono- or poly-alkoxybenzenes, and mixtures thereof.

Exemplary solution deposition techniques include printing and coating techniques such spin-coating, dip-coating, roll-to-roll coating or roll-to-roll printing, doctor blade coating, slot die coating, gravure printing, screen printing and inkjet printing.

Solution deposition methods may be used to form other layers of an OLED including (where present) a hole injection layer, a charge transporting layer and a charge blocking layer.

Applications

An infrared emitting organic light-emitting diode as described herein may be used, without limitation, in night vision goggles, sensors and CMOS chips. A sensor may comprise one or more OLEDs as described herein and at least one photodetector device, the or each photodetector device being configured to detect emission from the one more OLEDs. Optionally, the OLED of a sensor, preferably the OLED of a wearable sensor, has an operating voltage of no more than 5V.

Examples

Measurements

HOMO and LUMO levels were measured by square wave voltammetry in which the working electrode potential is ramped linearly versus time. When cyclic voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV comprised a cell containing a tert-butyl ammonium perchlorate/or tertbutyl ammonium hexafluorophosphate solution in acetonitrile, a glassy carbon working electrode where the sample is coated as a film, a platinum counter electrode (donor or acceptor of electrons) and a reference glass electrode no leak Ag/AgCl. Ferrocene was added in the cell at the end of the experiment for calculation purposes (measurement of the difference of potential between Ag/AgCl/ferrocene and sample/ferrocene).

Method and Settings:

3 mm diameter glassy carbon working electrode
Ag/AgCl/no leak reference electrode
Pt wire auxiliary electrode
0.1 M tetrabutylammonium hexafluorophosphate in acetonitrile LUMO=4.8−ferrocene (peak to peak maximum average)+onset Sample: 1 drop of 5 mg/mL in toluene spun @3000 rpm LUMO (reduction) measurement:

A good reversible reduction event is typically observed for thick films measured at 200 mV/s and a switching potential of −2.5V. The reduction events were measured and compared over 10 cycles, with measurements taken on the $3^{rd}$ cycle. The onset was taken at the intersection of lines of best fit at the steepest part of the reduction event and the baseline.

Synthesis

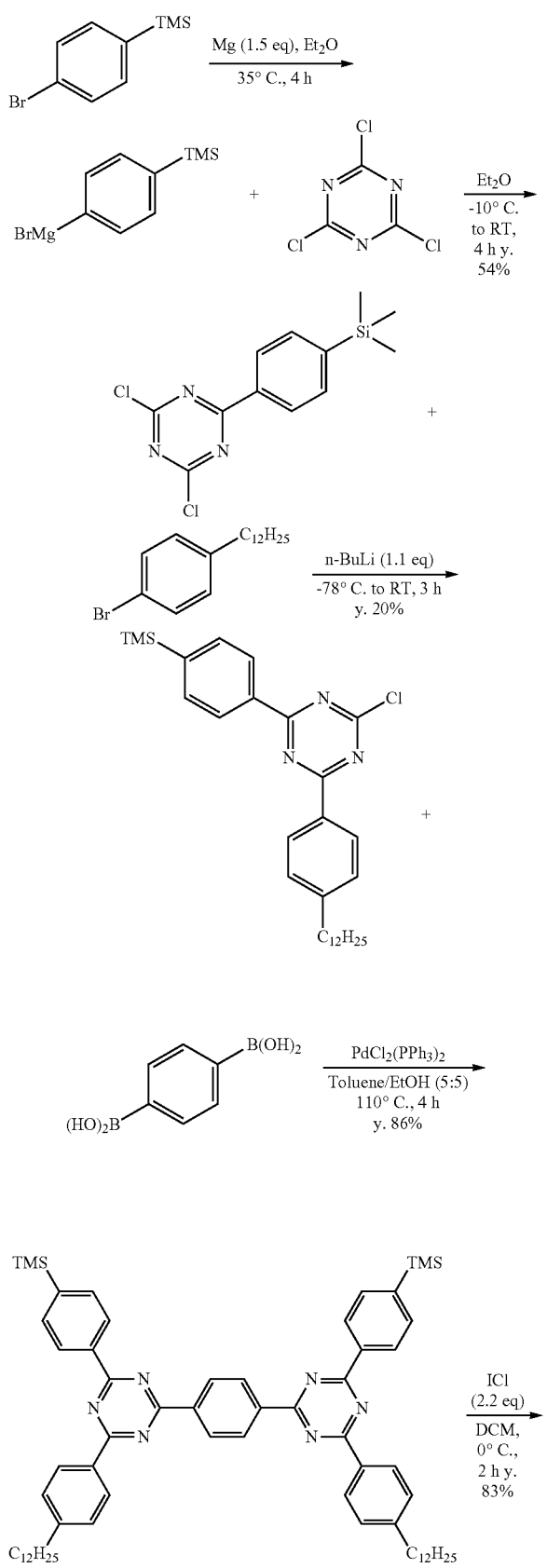

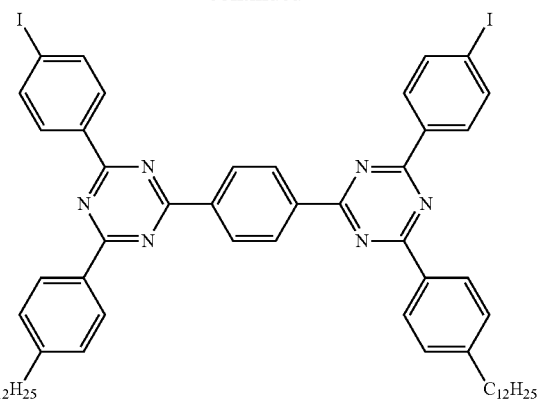

Materials Data

LUMO levels of structures illustrated in Table 1 were measured by square wave voltammetry.

As shown in Table 1, Compound Example 1 has a LUMO that is deeper (further from vacuum) than that of Comparative Compound 1.

| Compound | LUMO (eV) |
|---|---|
| 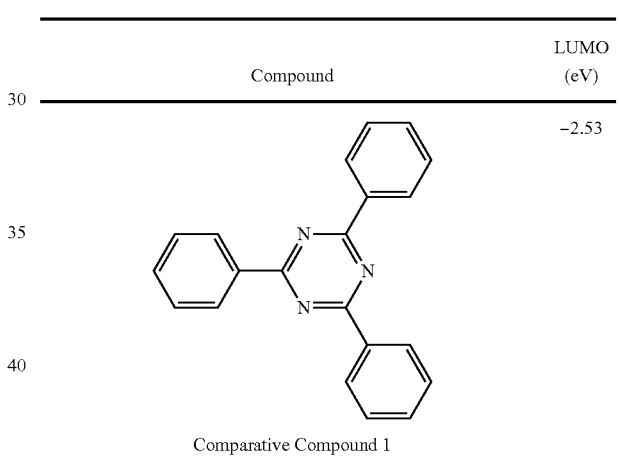<br>Comparative Compound 1 | −2.53 |
| 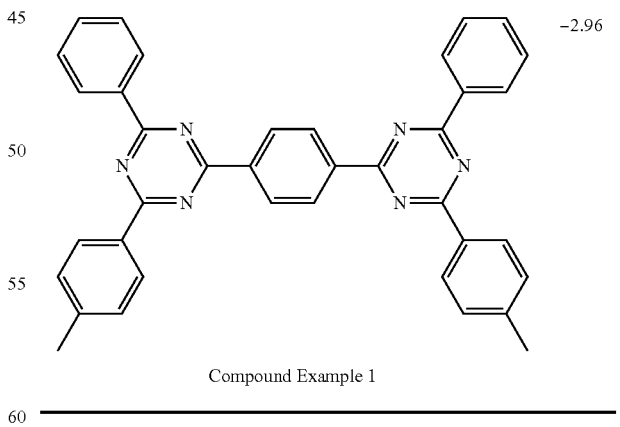<br>Compound Example 1 | −2.96 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A composition comprising a light-emitting material having a photoluminescent spectrum with a peak wavelength of more than 600 nm and non-polymeric material of formula (I):

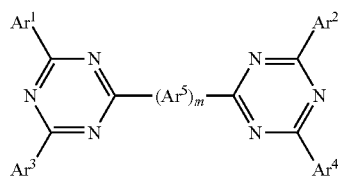

wherein:
Ar¹, Ar², Ar³ and Ar⁴ are each independently a $C_{6-20}$ aryl group which is unsubstituted or substituted with one or more substituents,
Ar⁵ independently in each occurrence is

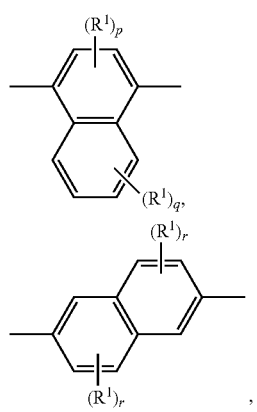

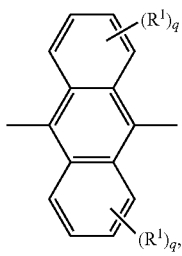

, or

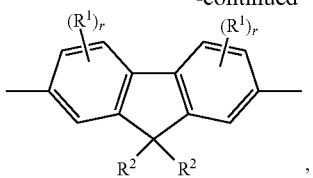

wherein $R^1$ in each occurrence is independently a substituent; $R^2$ in each occurrence is independently a substituent wherein the $R^2$ groups may be linked to form a ring; p is 0, 1, or 2; q is 0, 1, 2, 3, or 4; and r is 0, 1, 2, or 3;
and m is 1, 2 or 3.

2. A composition according to claim 1 wherein Ar¹, Ar², Ar³ and Ar⁴ are each independently phenyl which is unsubstituted or substituted with one or more substituents.

3. A composition according to claim 1 wherein the light-emitting material has a photoluminescent spectrum with a peak of at least 650 nm.

4. A composition according to claim 3 wherein the light-emitting material has a photoluminescent spectrum with a peak of at least 700 nm.

5. A composition according to claim 1 wherein the light-emitting material is a phosphorescent material.

6. A solution comprising a composition according to claim 1 dissolved in one or more solvents.

7. An organic light-emitting device comprising an anode, a cathode and a light-emitting layer between the anode and cathode wherein the light-emitting layer comprises a composition according to claim 1.

8. A method of forming an organic light-emitting device according to claim 7 comprising the step of depositing the light-emitting layer over one of the anode and cathode, and depositing the other of the anode and cathode over the light-emitting layer.

9. A method according to claim 8 wherein the light-emitting layer is formed by depositing a solution and evaporating the one or more solvents.

* * * * *